(12) United States Patent
Carter et al.

(10) Patent No.: US 8,053,306 B2
(45) Date of Patent: Nov. 8, 2011

(54) PFET WITH TAILORED DIELECTRIC AND RELATED METHODS AND INTEGRATED CIRCUIT

(75) Inventors: Rick Carter, Hopewell Junction, NY (US); Michael P. Chudzik, Danbury, CT (US); Rashmi Jha, Wappingers Falls, NY (US); Naim Moumen, Walden, NY (US)

(73) Assignees: International Business Machines Corporation, Armonk, NY (US); Advanced Micro Devices, Inc., Sunnyvale, CA (US)

( * ) Notice: Subject to any disclaimer, the term of this patent is extended or adjusted under 35 U.S.C. 154(b) by 494 days.

(21) Appl. No.: 11/955,491

(22) Filed: Dec. 13, 2007

(65) Prior Publication Data

US 2009/0152637 A1    Jun. 18, 2009

(51) Int. Cl.
*H01L 21/8238* (2006.01)
*H01L 27/092* (2006.01)

(52) U.S. Cl. . 438/228; 438/224; 257/371; 257/E21.632; 257/E21.639

(58) Field of Classification Search .................. 438/199, 438/224, 228; 257/E21.632, E21.639, 371
See application file for complete search history.

(56) References Cited

U.S. PATENT DOCUMENTS

| | | | |
|---|---|---|---|
| 6,787,413 B2 * | 9/2004 | Ahn et al. | 438/240 |
| 2002/0025626 A1 | 2/2002 | Hattangady et al. | |
| 2005/0051828 A1 * | 3/2005 | Park et al. | 257/310 |
| 2006/0030096 A1 | 2/2006 | Weimer | |
| 2006/0094183 A1 * | 5/2006 | Wieczorek et al. | 438/202 |
| 2006/0172480 A1 | 8/2006 | Wang et al. | |
| 2007/0178634 A1 | 8/2007 | Jung et al. | |

* cited by examiner

*Primary Examiner* — Thao Le
*Assistant Examiner* — Tanika Warrior
(74) *Attorney, Agent, or Firm* — Joseph Abate; Hoffman Warnick LLC

(57) ABSTRACT

A PFET having tailored dielectric constituted in part by an NFET threshold voltage (Vt) work function tuning layer in a gate stack thereof, related methods and integrated circuit are disclosed. In one embodiment, the PFET includes an n-type doped silicon well (N-well), a gate stack including: a doped band engineered PFET threshold voltage (Vt) work function tuning layer over the N-well; a tailored dielectric layer over the doped band engineered PFET Vt work function tuning layer, the tailored dielectric layer constituted by a high dielectric constant layer over the doped band engineered PFET Vt work function tuning layer and an n-type field effect transistor (NFET) threshold voltage (Vt) work function tuning layer over the high dielectric constant layer; and a metal over the NFET Vt work function tuning layer.

18 Claims, 2 Drawing Sheets

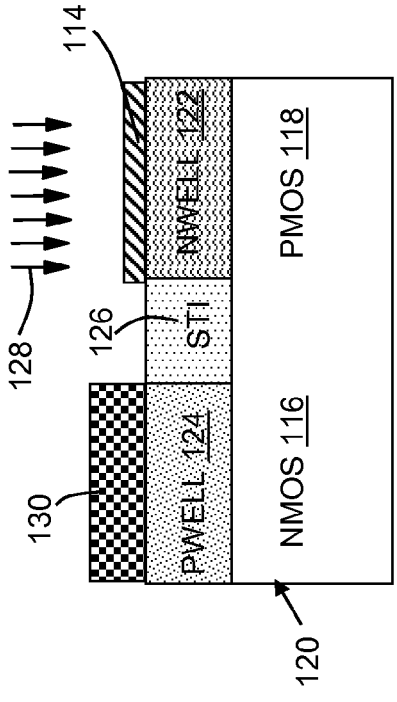
FIG. 1 (PRIOR ART)
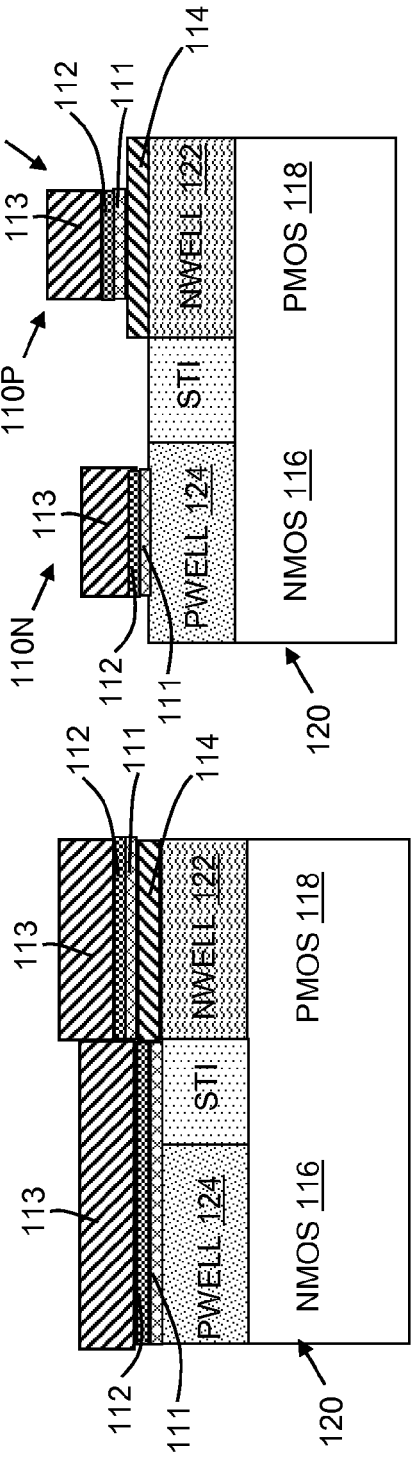
FIG. 2
FIG. 3
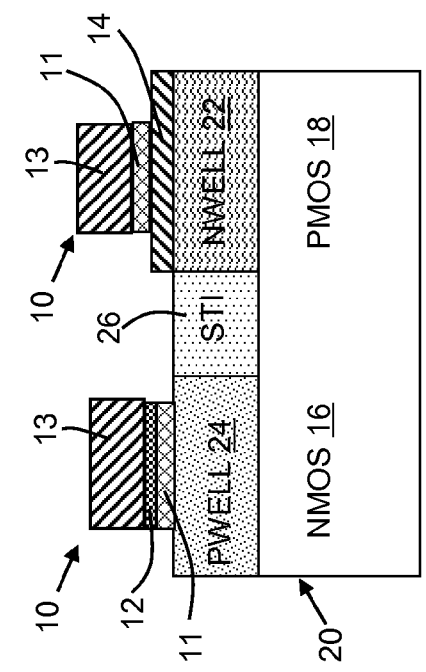
FIG. 4

PFET WITH TAILORED DIELECTRIC AND RELATED METHODS AND INTEGRATED CIRCUIT

BACKGROUND

1. Technical Field

The disclosure relates generally to integrated circuit fabrication, and more particularly, to a PFET having a tailored dielectric constituted in part by an NFET threshold voltage (Vt) work function tuning layer in a gate stack thereof and related methods and integrated circuit.

2. Background Art

Referring to FIG. 1, the best known self aligned process flows for complementary metal oxide semiconductor (CMOS) fabrication with the high dielectric constant (high-k) dielectrics and metal gate stack 10 use a dual field effect transistor (FET) threshold voltage (Vt) work function tuning layers 12, 14 to tune the threshold voltage of adjacent n-type metal oxide semiconductor (NMOS) region 16 (for NFETs) and p-type metal oxide semiconductor (PMOS) region 18 (for PFETs). The work function tuning layers 12, 14 have been developed to address instability caused by use of high-k dielectrics 11 with metals 13 in gate stack 10. NMOS region 16 and PMOS region 18 are typically formed in a silicon substrate 20 having doped N-well 22 and P-well 24 separated by an isolation region 26, e.g., a shallow trench isolation (STI) of silicon oxide. The formation of FET Vt work function tuning layers 12, 14 requires masking of one of the adjacent NMOS and PMOS regions to remove the other region's Vt work function tuning layer over one side. In particular, as illustrated, a p-type field effect transistor (PFET) Vt work function tuning layer 14 is formed over PMOS region 18, and a high-k dielectric 11 such as hafnium oxide ($HfO_2$) is formed over both regions 16, 18. An NFET Vt work function tuning layer 12 is then deposited over both regions 16, 18, but removed over PMOS region 18 since the NFET Vt work function tuning layer 12 is undesirable for the PFET. NFET Vt work function tuning layer 12 typically includes lanthanum (La), magnesium (Mg), barium (Ba), strontium (Sr) and other rare earth metals while the PFET Vt work function tuning layer 14 typically includes undoped silicon germanium (SiGe). Patterning of gate stack 10 then completes the process. This process is costly to manufacture because of the two extra lithography steps and disadvantageously increases process variability due to the need for the removal of the Nfet Vt tuning layer from the PFET.

SUMMARY

A PFET having a tailored dielectric constituted in part by an NFET threshold voltage (Vt) work function tuning layer in a gate stack thereof, related methods and integrated circuit are disclosed. In one embodiment, the PFET includes an n-type doped silicon well (N-well), and a gate stack including: a doped band engineered PFET threshold voltage (Vt) work function tuning layer over the N-well; a tailored dielectric layer over the doped PFET Vt work function tuning layer, the tailored dielectric layer constituted by a high dielectric constant layer over the doped PFET Vt work function tuning layer and an n-type field effect transistor (NFET) threshold voltage (Vt) work function tuning layer over the high dielectric constant layer; and a metal over the NFET Vt work function tuning layer.

A first aspect of the disclosure provides a method comprising: providing an implanted substrate including an n-type metal oxide semiconductor (NMOS) region and a p-type metal oxide semiconductor (PMOS) region; forming a doped band engineered p-type field effect transistor (PFET) threshold voltage (Vt) work function tuning layer over the PMOS region only; forming a high dielectric constant layer over the implanted substrate; forming an n-type field effect transistor (NFET) threshold voltage (Vt) work function tuning layer over the high dielectric constant layer; forming a metal layer over the NFET Vt work function tuning layer; and patterning a first gate over the NMOS region and a second gate over the PMOS region, the second gate including the doped band engineered PFET Vt work function tuning layer and the NFET Vt work function tuning layer over the PMOS region.

A second aspect of the disclosure provides a p-type field effect transistor (PFET) comprising: an n-type doped silicon well (N-well); and a gate stack including: a doped band engineered PFET threshold voltage (Vt) work function tuning layer over the N-well; a tailored dielectric layer over the doped band engineered PFET Vt work function tuning layer, the tailored dielectric layer constituted by a high dielectric constant layer over the doped band engineered PFET Vt work function tuning layer and an n-type field effect transistor (NFET) threshold voltage (Vt) work function tuning layer over the high dielectric constant layer; and a metal over the NFET Vt work function tuning layer.

A third aspect of the disclosure provides an integrated circuit (IC) comprising: a p-type field effect transistor (PFET) including: an n-type doped silicon well (N-well); and a gate stack including: a doped band engineered PFET threshold voltage (Vt) work function tuning layer over the N-well; a tailored dielectric layer over the doped band engineered PFET Vt work function tuning layer, the tailored dielectric layer constituted by a high dielectric constant layer over the doped band engineered PFET Vt work function tuning layer and an n-type field effect transistor (NFET) threshold voltage (Vt) work function tuning layer over the high dielectric constant layer; and a metal over the tailored dielectric layer.

The illustrative aspects of the present disclosure are designed to solve the problems herein described and/or other problems not discussed.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which:

FIG. 1 shows a conventional PFET and NFET with related work function tuning layers.

FIGS. 2-5 show embodiments of a method of forming a PFET and resulting PFET and NFET according to the disclosure.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

Figure 5:
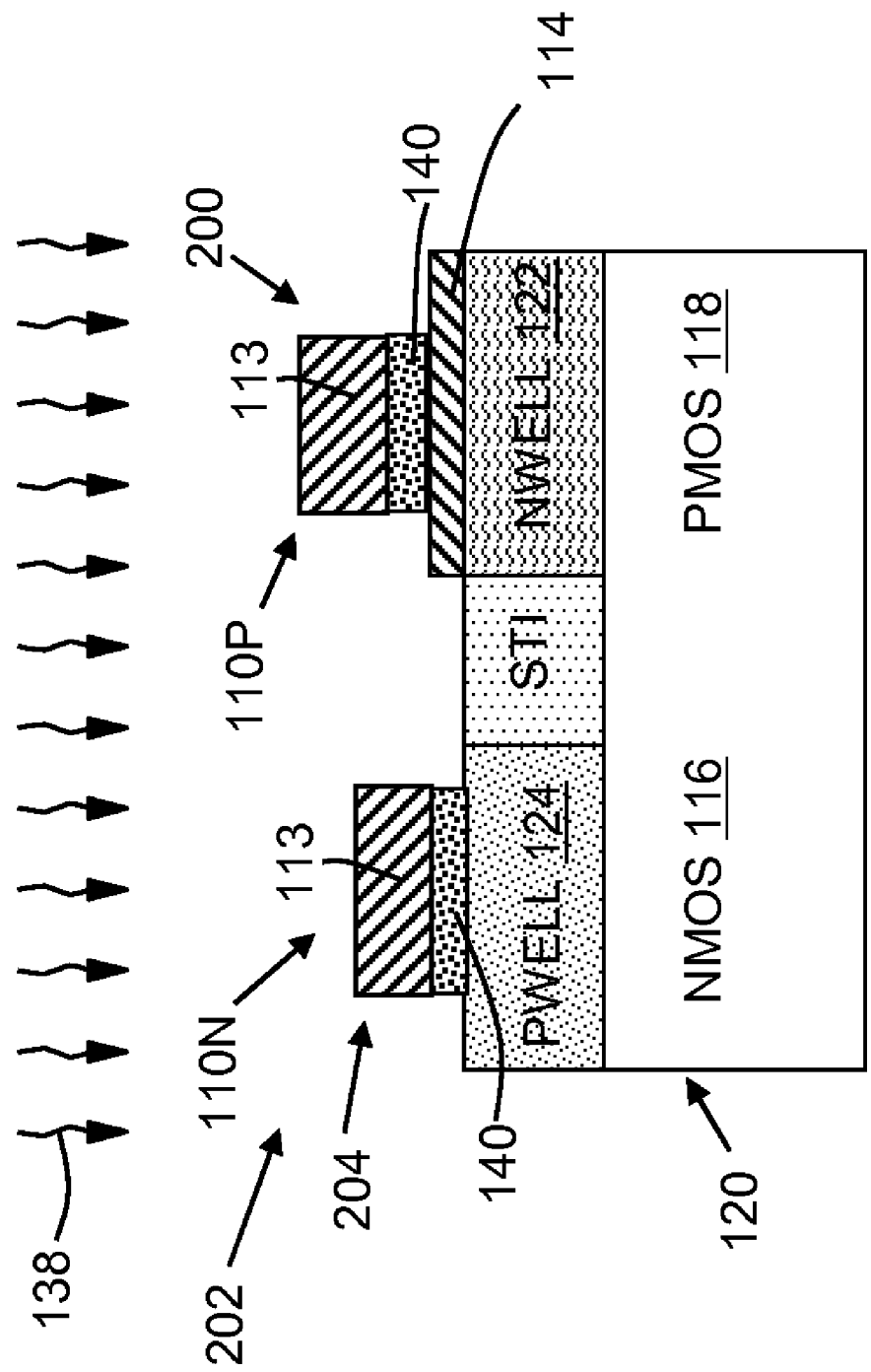

Referring to FIGS. 2-5, embodiments of a method of forming, inter alia, a p-type field effect transistor (PFET) 200 (FIG. 5) and integrated circuit 202 (FIG. 5) are illustrated. FIG. 2 shows providing an implanted substrate 120 including an n-type metal oxide semiconductor (NMOS) region 116 and a p-type metal oxide semiconductor (PMOS) region 118. In particular, NMOS region 116 and PMOS region 118 may include a doped N-well 122 and doped P-well 124 separated by an isolation region 126, e.g., a shallow trench isolation (STI) of silicon oxide. N-type and p-type dopants may be any appropriate dopants now known or later developed. Implanted substrate 120 may include but is not limited to silicon, germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Furthermore, a portion or entire semiconductor substrate 120 may be strained. Implanted substrate 120 may be formed using any now known or later developed processes, e.g., deposition, masking, ion implantation, etc.

FIG. 2 also shows forming a doped p-type field effect transistor (PFET) threshold voltage (Vt) work function tuning layer 114 over PMOS region 118 only. In one embodiment, doped band engineered PFET Vt work function tuning layer 114 includes boron or fluorine doped silicon germanium. "Doped band engineered" indicates the incorporating of materials with desirable offset in valence band compared to silicon (Si) such as silicon germanium ($Si_xGe_{1-x}$), or incorporating channel/substrate that forms interfacial layer having negative fixed charge at high dielectric constant materials and substrate interface and confining the counter-doping at the dielectric/substrate interface. PFET Vt work function tuning layer 114 may be formed, for example, by epitaxial growth of silicon with in-situ doping with germanium and boron or fluorine, or by epitaxial growth of silicon germanium and in-situ implantation of boron or fluorine, or by epitaxial growth of silicon germanium and ex-situ implant of boron or fluorine and other species using plasma based or vapor phase implants techniques, or by any other now known or later developed process. A mask 130 is used to protect NMOS region 116 during this process, i.e., P-well 124. Doped band engineered PFET Vt work function tuning layer 114 in this form has been found to allow NFET Vt work function tuning layer 112 (FIG. 3) to exist within the resulting PFET gate stack 110P (FIG. 4) and not be affected by the presence of NFET Vt work function tuning layer 112 (FIG. 4), as described below. That is, doped band engineered PFET Vt work function tuning layer 112 achieves a band edge threshold voltage in a resulting PFET 200 (FIG. 5) despite the presence of NFET Vt work function tuning layer 112 (FIG. 4). Additionally, the presence of NFET Vt work function tuning layer 112 provides scaling and reduction in the gate leakage current for PFET stacks. This eliminates the need for an extra lithography step to pattern the NFET Vt work function tuning layer 112 and its removal from the PFET areas, thus provides cost effectiveness.

Referring to FIG. 3, a high dielectric constant (high-k) layer 111, an n-type field effect transistor (NFET) threshold voltage (Vt) work function tuning layer 112 and a metal layer 113 are formed over implanted substrate 120. That is, high-k layer 111, NFET Vt work function tuning layer 112 and metal layer 113 are formed (e.g., by appropriate deposition technique(s)) over N-well 120 and P-well 122. "Depositing" may include any now known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation. In one embodiment, high-k layer 112 includes hafnium dioxide ($HfO_2$), however, other high-k materials may also be employed such as, but not limited to: hafnium silicate (Hf-$SiO_x$), zirconium silicate ($ZrSiO_x$), zirconium oxide ($ZrO_2$), silicon oxide ($SiO_2$), silicon nitride ($Si_3N_4$), silicon oxynitride (SiON), other high-k material or any combination of these materials. In one embodiment, NFET Vt work function tuning layer 112 includes lanthanum oxide (LaO), however, other work function tuning layers 112 capable of achieving a band edge threshold voltage in a resulting NFET may be employed such as but not limited to: barium oxide, magnesium oxide and strontium oxide, species including barium (Ba), magnesium (Mg), strontium (Sr), and rare earth metals. Metal layer 113 may include any now known or later developed metal or alloy capable of forming a gate electrode such as titanium nitride (TiN), tantalum nitride (TaN), titanium silicon nitride (TiSiN), tantalum silicon nitride (TaSiN) and any other metal gate electrodes.

FIG. 4 shows patterning a first gate 110N over NMOS region 116 and a second gate 110P over PMOS region 118, i.e., simultaneously. As illustrated, second gate 110P (for a PFET) includes doped band-engineered PFET Vt work function tuning layer 114 and NFET Vt work function tuning layer 112 over PMOS region 118. Hence, the above-described processing eliminates the need for removing NFET Vt work function tuning layer 112 over PMOS region 118, thus reducing costs and simplifying processing. As shown in FIG. 5, an anneal 138, which may occur as part of later processing (not shown), causes NFET Vt work function tuning layer 112 (FIG. 4) to blend with high dielectric constant layer 111 to form a single tailored dielectric layer 140, which acts as a gate dielectric.

As shown in FIG. 5, the above-described processing results in a PFET 200 and IC 202. PFET 200 includes an N-well 122 and a gate stack 110P. Gate stack 110P, in contrast to conventional gate stacks, includes doped band engineered PFET Vt work function tuning layer 114 over N-well 122, high-k layer 112 over doped band engineered PFET Vt work function tuning layer 114, a NFET Vt work function tuning layer 112 over high-k layer 111 and a metal 113 over NFET Vt work function tuning layer 112. IC 202 may further include NFET 204 including P-well 124 and a gate stack 110 N including tailored dielectric layer 140 over P-well 124 and metal 113 over the tailored dielectric layer.

The above-described methods and resulting structure provide a self aligned CMOS process flow/structure where NFET and PFET band edge Vt can be achieved by having just one Vt work function tuning layer 114. This is possible by providing the doped band engineered PFET Vt work function tuning layer 114 and tailored dielectric layer 140.

The methods as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The foregoing description of various aspects of the disclosure has been presented for purposes of illustration and description. It is not intended to be exhaustive or to limit the disclosure to the precise form disclosed, and obviously, many modifications and variations are possible. Such modifications and variations that may be apparent to a person skilled in the art are intended to be included within the scope of the disclosure as defined by the accompanying claims.

What is claimed is:

1. A method comprising:
providing an implanted substrate including an n-type metal oxide semiconductor (NMOS) region and a p-type metal oxide semiconductor (PMOS) region;
forming a mask over the NMOS region;
epitaxially growing a layer including silicon and doping or implanting the layer including silicon to form a doped band engineered p-type field effect transistor (PFET) threshold voltage (Vt) work function tuning layer over the PMOS region only;
removing the mask to expose the NMOS region of the implanted substrate;
forming a high dielectric constant layer over the NMOS region of the implanted substrate and the PFET Vt work function tuning layer;
forming an n-type field effect transistor (NFET) threshold voltage (Vt) work function tuning layer over the high dielectric constant layer;
forming a metal layer over the NFET Vt work function tuning layer; and
patterning a first gate over the NMOS region and a second gate over the PMOS region, the second gate including the doped band engineered PFET Vt work function tuning layer directly over the PMOS region, the high dielectric constant layer directly over the doped band engineered PFET Vt work function tuning layer, and the NFET Vt work function tuning layer directly over the high dielectric constant layer.

2. The method of claim 1, further comprising annealing, causing the NFET Vt work function tuning layer to blend with the high dielectric constant layer to form a single layer.

3. The method of claim 1, wherein the doped band engineered PFET Vt work function tuning layer includes boron doped silicon germanium in the case that the layer including silicon is doped.

4. The method of claim 1, wherein the NFET Vt work function tuning layer is selected from the group consisting of: lanthanum oxide, barium oxide, magnesium oxide and strontium oxide.

5. The method of claim 1, wherein the high dielectric constant layer is selected from the group consisting of: hafnium dioxide, hafnium silicate (HfSiOx), zirconium silicate (ZrSiOx), zirconium oxide (ZrO2), silicon oxide (SiO2), silicon nitride (Si3N4) and silicon oxynitride (SiON).

6. The method of claim 1, wherein the metal layer is selected from the group consisting of: titanium nitride (TiN), tantalum nitride (TaN), titanium silicon nitride (TiSiN) and tantalum silicon nitride (TaSiN).

7. A p-type field effect transistor (PFET) comprising:
an n-type doped silicon well (N-well); and
a gate stack including:
a doped band engineered PFET threshold voltage (Vt) work function tuning layer directly over the N-well;
a tailored dielectric layer over the doped band engineered PFET Vt work function tuning layer, the tailored dielectric layer including a high dielectric constant layer and an n-type field effect transistor (NFET) threshold voltage (Vt) work function tuning layer directly over and having been annealed with the high dielectric constant layer; and
a metal over the NFET Vt work function tuning layer.

8. The PFET of claim 7, wherein the doped band engineered PFET Vt work function tuning layer includes boron or fluorine doped silicon germanium.

9. The PFET of claim 7, wherein the NFET Vt work function tuning layer is selected from the group consisting of: lanthanum oxide, barium oxide, magnesium oxide and strontium oxide.

10. The PFET of claim 7, wherein the high dielectric constant layer is selected from the group consisting of: hafnium dioxide, hafnium silicate (HfSiOx), zirconium silicate (ZrSiOx), zirconium oxide (ZrO2), silicon oxide (SiO2), silicon nitride (Si3N4) and silicon oxynitride (SiON).

11. The PFET of claim 7, wherein the metal layer is selected from the group consisting of: titanium nitride (TiN), tantalum nitride (TaN), titanium silicon nitride (TiSiN) and tantalum silicon nitride (TaSiN).

12. An integrated circuit (IC) comprising:
a p-type field effect transistor (PFET) including:
an n-type doped silicon well (N-well); and
a gate stack including:
a doped band engineered PFET threshold voltage (Vt) work function tuning layer directly over the N-well;
a tailored dielectric layer over the doped band engineered PFET Vt work function tuning layer, the tailored dielectric layer including a high dielectric constant layer and an n-type field effect transistor (NFET) threshold voltage (Vt) work function tuning layer directly over and having been annealed with the high dielectric constant layer; and
a metal over the tailored dielectric layer.

13. The IC of claim 12, further comprising an n-type field effect transistor (NFET) adjacent to the PFET, the NFET including:
an p-type doped silicon well (P-well);
a gate stack including the high dielectric constant layer over the p-well and the metal over the tailored dielectric layer.

14. The IC of claim 13, further comprising an isolation region between the PFET and the NFET.

15. The IC of claim 12, wherein the doped band engineered PFET Vt work function tuning layer includes boron or fluorine doped silicon germanium.

16. The IC of claim 12, wherein the NFET Vt work function tuning layer is selected from the group consisting of: lanthanum oxide, barium oxide, magnesium oxide and strontium oxide.

17. The IC of claim 12, wherein the high dielectric constant layer is selected from the group consisting of: hafnium dioxide, hafnium silicate (HfSiOx), zirconium silicate (ZrSiOx), zirconium oxide (ZrO2), silicon oxide (SiO2), silicon nitride (Si3N4) and silicon oxynitride (SiON).

18. The IC of claim 12, wherein the metal layer is selected from the group consisting of: titanium nitride (TiN), tantalum nitride (TaN), titanium silicon nitride (TiSiN) and tantalum silicon nitride (TaSiN).

* * * * *